United States Patent [19]

Uchiyama et al.

[11] Patent Number: 4,962,062

[45] Date of Patent: Oct. 9, 1990

[54] METHOD OF TIGHTLY JOINING TWO SEMICONDUCTOR SUBSTRATES

[75] Inventors: Makoto Uchiyama, Zushi; Hidetoshi Nojiri, Yokosuka, both of Japan

[73] Assignee: Nissan Motor Company, Limited, Yokohama, Japan

[21] Appl. No.: 238,421

[22] Filed: Aug. 31, 1988

[30] Foreign Application Priority Data

Sep. 11, 1987 [JP] Japan .................. 62-226262

[51] Int. Cl.$^5$ ........................................... H01L 21/76
[52] U.S. Cl. ..................................... 437/225; 437/67; 437/946; 437/974; 148/DIG. 12; 148/DIG. 135
[58] Field of Search ............... 437/225, 208, 67, 946, 437/974, 946; 148/DIG. 12, DIG. 71, DIG. 135; 156/273.9; 357/66, 20, 55

[56] References Cited

U.S. PATENT DOCUMENTS

| 4,638,552 | 1/1987 | Shimbo et al. | 148/DIG. 12 |
| 4,700,466 | 10/1987 | Nakagawa et al. | 437/915 |
| 4,738,935 | 4/1988 | Shimbo et al. | 437/225 |

FOREIGN PATENT DOCUMENTS

| 3738670A1 | 5/1988 | Fed. Rep. of Germany. | |
| 0220456 | 9/1986 | Japan | 437/225 |

Primary Examiner—Olik Chaudhuri
Assistant Examiner—Tuan Nguyen
Attorney, Agent, or Firm—Foley & Lardner, Schwartz, Jeffery, Schwaab, Mack, Blumenthal & Evans

[57] ABSTRACT

Two semiconductor substrates, each having a polished surface and at least one groove is formed in the surface of at least one of the two substrates, are tightly and inseparably joined by the steps of wetting the polished surface of at least one of the two substrates with a liquid not containing any solute that causes precipitation of a solid substance upon evaporation of the liquid, e.g. methanol or water, placing one substrate on the other so as to bring the polished surfaces of the two substrates into contact with each other with intervention of a thin film of the liquid therebetween and, after a while, subjecting the provisionally joined substrates to a heat treatment and then forming a dielectric layer of organic polymer or silicon compound in at least one groove. This method is suitable for joining silicon substrates such as silicon wafers now on the market. The two semiconductor substrates may be different in the type of conductivity or in the concentration of impurity, and at least one of the two substrates may have a diffused layer, a dielectric layer of a polycrystalline layer as a surface layer having the polished surface.

10 Claims, 6 Drawing Sheets

METHOD OF TIGHTLY JOINING TWO SEMICONDUCTOR SUBSTRATES

BACKGROUND OF THE INVENTION

This invention relates to a method of tightly joining two semiconductor substrates together by using a simple liquid to wet the substrate surfaces to be brought into contact with each other.

In the manufacture of semiconductor devices it is an essential process to form with high accuracy and good reproducibility a plurality of regions with different impurity concentrations within a semiconductor substrate. Thus far, this purpose is accomplished by selectively using well known techniques, such as impurity diffusion, ion implantation and epitaxial growth. However, in the case of forming a very thick layer having a specific conductivity and a thickness of hundreds of microns, it is impracticable to achieve the object by the usual diffusion or implantation technique, and it takes a very long time to form such a thick layer by epitaxial growth.

To obviate the difficulty of forming such a thick layer in a substrate, it is conceivable to join two semiconductor substrates different in impurity concentration with an adhesive. However, adhesives useful for this purpose usually comprises a polymeric material, which prevents establishment of ohmic contact between the two substrates joined together and causes intrusion of a large amount of foreign matter into the substrate obtained by the joining.

In some devices using semiconductive materials, such as pressure sensors having a silicon diaphragm, it is possible to bond a silicon part to a substrate with a nonconductive adhesive such as a low melting point glass. However, the resultant joints are not always sufficient in strength of adhesion and, when thermally stressed, are liable to break because of a significant difference of the expansion coefficient of the adhesive glass from that of silicon.

JP-A No. 60-51700 shows a method of joining two silicon substrates together, comprising the steps of polishing the opposite surfaces of the substrates, rendering the polished surfaces hydrophilic by treating with a suitable liquid such as a mixture of an acid and hydrogen peroxide, and, after drying, bringing the treated surfaces into tight contact with each other. However, by this method accurate alignment of the two substrates is difficult, because once the subtrates are brought into contact with each other, there occurs strong cohesion which prevents correcting location by sliding one of the substrates on the other. As another matter of inconvenience, the hydrophilic surfaces of the substrates must be left exposed until the joining operation and hence are liable to be damaged or contaminated. Besides, the joining operation needs to be performed in vacuum because if air remains at the interface between the joined substrates the nitrogen and oxygen atoms, which have unfavorable influences on the contacting surfaces, cannot easily be diffused even by making a heat treatment at about 1000° C.

SUMMARY OF THE INVENTION

It is an object of the present invention to provide a method of tightly and practically inseparably joining two semiconductor substrates by simple operations without using any adhesive obstructive to the creation of an ohmic joint.

To accomplish the above object the present invention provides a method which comprises the steps of providing two semiconductor substrates each of which has a flat and polished surface, wetting the polished surface of at least one of the two substrates with a liquid not containing any solute which causes precipitation of a solid substance when the liquid evaporates, placing one of the two substrates on the other so as to bring said surfaces of the respective substrates into contact with each other with intervention of a thin film of said liquid therebetween to thereby provisionally join the two substrates, and subjecting the two substrates in the provisionally joined state to a heat treatment at a temperature lower than the melting temperature of the material of the semiconductor substrates.

This method is very suitable for application to silicon substrates including silicon wafers on the market. The liquid to wet the polished surfaces of the semiconductor substrates can be selected from simple and inexpensive liquids such as alcohols, acetic acid, formic acid, water and aqueous ammonia solution. That is, associative liquids are suitable for use in this method. In most cases, methanol or water is preferable. In the case of joining silicon substrates, it is suitable to carry out the aforementioned heat treatment at a temperature in the range from about 500° C. to about 1200° C.

The method according to the invention has many advantages. It is possible to tightly join two semiconductor substrates into a unitary substrate in which the strength of the joint between the original two substrates is comparable to the strength of the bulk of the substrate, and the joint is an ohmic contact. The substrate surfaces to be brought into contact with each other can be kept clean without difficulty since the wetting of the substrate surfaces is not followed by a drying operation which is liable to result in contamination of the surfaces with dust. When one substrate is placed on the other the intervening liquid film allows either of the two substrates to be slid on the other, so that alignment of the two substrates can easily be accomplished without damaging the contacting surfaces of the substrates. The joining operations do not need to be performed in vacuum because the liquid film intervening between the two substrates inhibits intrusion of air into the interface. It is easy to produce a thin liquid film of uniform thickness between the two substrates, since the liquid is an incompressible material, and hence this joining method is suitable for mass production. No pretreatment needs to be made on the substrates to be joined except polishing of the surfaces to be wetted and brought into contact with each other. In the case of using silicon wafers on the market, there is no need of polishing the wafer surfaces since commercial silicon wafers have a sufficiently polished surface.

The two semiconductor substrates to be joined may be different in the type of conductivity or in impurity concentration. Accordingly it is possible to obtain a unitary substrate having a very thick "diffused layer". Either or each of the two substrates may have a surface layer different from the base region in the type of conductivity or impurity concentration or even in material. Accordingly a unitary substrate having a buried layer or having a sandwich structure can easily be obtained, and the buried layer or the intermediate layer of the sandwich structure can be a dielectric layer or a polycrystalline layer.

The following is an explanation of the mechanism of the interfacial joining according to the invention, in particular with respect to joining of silicon substrates.

It is a frequently observed phenomenon that a polished surface makes tight contact with another polished surface when a thin liquid film intervenes between the two surfaces. The phenomenon is known as mirror face effect. If the polished surfaces are very flat and smooth, fairly tight contact is made without intervention of a liquid film.

Commercial silicon wafers for semiconductor devices have a polished surface which is usually below 500 Å in surface roughness. Therefore, the polished surfaces of two silicon wafers make tight contact with each other when the surfaces are wetted. One reason for the tight contact is the creation of a negative pressure by capillary action. However, there are other important reasons.

In the atmosphere each surface of a silicon wafer is covered with a naturally formed oxide film, which can be regarded as an adsorption layer not much thicker than a monomolecular layer. The thickness of the oxide film never exceeds 20 Å. It is widely accepted that the natural oxide film contains silanol groups formed by the combination of hydroxyl group with the dangling bonds of silicon atoms in the wafer surface. Also it is accepted that these silanol groups easily combine with the moisture in the air and, hence, form a hydrogen bond. In the present invention an associative liquid is used to wet the silicon wafer surfaces. It is presumed that the associative liquid will combine with the hydrogen bond of the silanol groups. Besides, the interaction between the associative liquid in the form of thin film and either of the adjacent solid surfaces is stronger than the interaction between the liquid molecules attributed to the constitutiveness of the liquid bulk, and the thin liquid film is apt to gain that information. Therefore, when the provisionally joined two wafers are subjected to heat treatment the intervening liquid film does not transform by the route of gradual vaporization and expansion (if transformation by this route occurs the two wafers will separate or break). Instead, the liquid film will quickly diffuse into the bulk of the silicon wafers. The dissipation of the liquid in such a manner creates a negative pressure at the interface so that the contact between the two wafer surfaces further tightens.

Among associative liquids, water is said to be highest in its constitutiveness. When water was used in place of methanol in joining two silicon wafers by the method according to the invention, heating of the provisionally joined substrates to about 500° C. sometimes resulted in break of the contact between the two wafers. Presumably the water film between the two wafers was not sufficiently thin due to high constitutiveness of water and, hence, by heating vaporized and expanded before diffusing into the wafers. Also it is presumable that, due to high constitutiveness, the transformation of the heated water concentrated in the critical point so that a so-called bumping phenomonon occurred. In other words, we presume that, under heating, the interaction between water molecules is stronger than the interaction between the water film and the silicon wafer surfaces so that water molecules activated within the bulk of the water film defeat the constitutiveness of water in the film surface, and that rapid expansion occurs in the bulk of the water film where dependency on the water-silicon interface is weak. Such presumptions are supported by the fact that when two silicon wafers are joined by using a liquid lower in constitutiveness than water, such as acetic acid or aqueous ammonia solution, in place of methanol or water, the obtained joint is as strong as the joint obtained by using methanol.

Heating induces a change in the chemical state of the silicon wafer surface. That is, vigorous oscillation of the silanol groups on the silicon oxide film surface initiates dehydrating decomposition reaction of alcohol to form one molecule of water from two hydroxyl groups, and an esterification reaction takes place:

The esterified reaction product, too, will decompose, and the simple molecules formed by these reactions will diffuse through the bulk of the silicon wafers. During this process silicon atoms on the opposite wafer surfaces will bond to each other initially as Si—O—Si bond and finally as Si—Si bond. It is presumable that at an initial stage of the above process the liquid film serves the function of smoothing the microscopical cavity structure of the silicon wafer surfaces. Under high temperatures the liquid film sandwiched between the wafers may behave differently from free liquid, and it is presumable that some silicon atoms dissolve and diffuse into the hot liquid film.

The method according to the invention can provide an inseparably unitary substrate even when the original substrate surfaces are water repellent. For example, using methanol it was possible to tightly join two silicon wafers after treating the wafer surfaces with hydrofluoric acid to render the surfaces water repellent. However, in that case use of water resulted in insufficient strength of the obtained joint in a considerable portion of the products.

DESCRIPTION OF THE PREFERRED EMBODIMENTS

Example 1

This example illustrates joining two wafers of single crystal silicon by a method according to the invention. The silicon wafers were 3-inch wafers on the market. As usual, in each wafer the principal surface for use in constructing devices was a polished mirrorlike surface.

In a clean room of Class 1000 (less than 1000 dust particles per cubic feet, in respect of 0.3 μm particles), methyl alcohol was dropped onto the polished surface of each of two silicon wafers to be joined so as to wet the entire area of the surface. That is, a thin film of methanol was formed on the polished surface of each wafer.

Then one of the two wafers was reversed and placed on the other wafer to bring the wetted surfaces of the respective wafers into tight contact, with care not to include bubbles in the liquid film intervening between the two wafers. Initially, it was easy to move either of the two wafers horizontally and relatively to the other. The two wafers were slid on each other several times and thereafter left still in air for several hours under a compressive load of $10^{-1}$ kg/cm$^2$. As the result the two wafers joined firmly and tightly to each other. Such joining could be caused also by merely repeating relative sliding of the two wafers many times.

In joining another pair of silicon wafers the polished surface of only one wafer was uniformly wetted with methanol, and the polished surface of the other wafer was brought into contact with the wetted surface, with care not to include bubbles in the liquid film. In air, the combination of the two wafers was placed horizontally on a hot plate kept at about 50° C. In several hours the two wafers joined firmly and tightly with natural conformance with each other in orientation flat.

In every case a strong bond was created between the two wafers such that it was not easy to separate the seemingly unitary combination into the original two wafers by thrusting pointed tips of a pair of stainless steel tweezers into the interface between the original two wafers. Even though the separation could be achieved, in most cases the silicon wafers themselves were damaged with the tweezers. On each of the forcibly separated wafers, interference fringes of methanol were observed. The thickness of the methanol film intervening between the two wafers was measured to be a few microns by the weighing method.

The above described treatments and operations were all made at normal temperature.

Next, the seemingly unitary combination of the two wafers, with the intervention of a thin film of methanol therebetween, was heated at about 100° C. for about 30 min and then subjected to an annealing heat treatment which was carried out in a nitrogen gas stream at about 1000° C. for about 90 min.

Through the heat treatment the combination of the two silicon wafers turned into a unitary member useful as a substrate for producing semeconductor devices. The obtained substrate was cut with a dicing saw into 2-mm square pieces, and a compressive shearing test was made on these pieces. The measurements of break strength ranged from 70 to 90 kg/cm$^2$, and observation of the broken pieces revealed that the specimens had broken randomly into several pieces and had rarely separated into two halves at the interface between the original two wafers. Such results of the test indicate that the two wafers were practically inseparably united into a single substrate. By electrical testing it was confirmed that ohmic contact was established at the interface between the original two wafers.

The above described process was repeated by widely varying the heating temperature at the final heat treatment, and it was proved that, insofar as the heating temperature is above about 500° C., the strength of the joint becomes nearly equal to the strength attained by heating at about 1000° C.

Besides, it was evidenced that, in place of methanol, ethanol or a still different alcohol, acetic acid, formic acid, water or aqueous ammonia solution can be used to successfully join two silicon wafers by the above described process.

Example 2

Figure 1A:
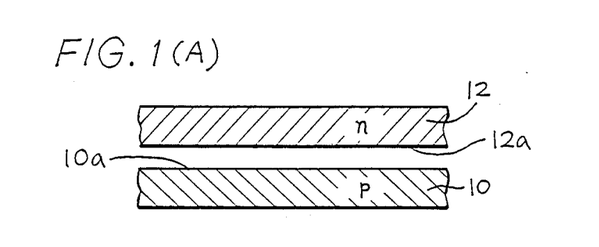
FIGS. 1(A) to 1(D) illustrate a process of uniting two semiconductor substrates different in the type of conductivity into a laminated substrate by a method according to the invention and producing mesa diodes by using the laminated substrate.

Referring to FIG. 1(A), a p-type silicon wafer 10 of low impurity concentration (resistivity: 8–12 ohm.cm) and an n-type silicon wafer 12 of low impurity concentration (resistivity: 8–12 ohm.cm) were joined by alternately using methanol and water to provide a liquid film between the two wafers. Each wafer was 3 inches in diameter. Methanol or water was dropped onto a polished surface 10a of the p-type wafer 10 to uniformly wet the surface 10a, and a polished surface 12a of the n-type wafer 12 was brought into contact with the wetted surface 10a.

Figure 1B:
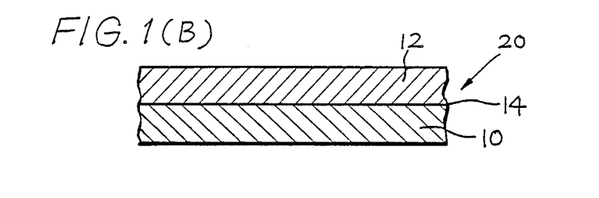

Referring to FIG. 1(B), in air the combination 20 of the two wafers 10, 12 was placed horizontally on a hot plate (not shown) maintained at 50°–70° C. and was left in that state for 50–150 hr. Numeral 14 indicates the interface at which a thin film (not shown) of methanol or water existed. Initially the n-type wafer 12 could be slid on the p-type wafer 10, but in several hours the two wafers 10 and 12 joined firmly and tightly with natural conformance with each other in flat orientation. In the case of using water, it took longer to reach such a state than for methanol. Next, the combination 20 of the two wafers was subjected to an annealing heat treatment, which was carried out in a nitrogen gas stream at about 1000° C. for 16 hr. As the result the combination 20 of the two wafers turned into an inseparably unitary substrate in which a p-n junction was created at the aforementioned interface 14.

Figure 1C:
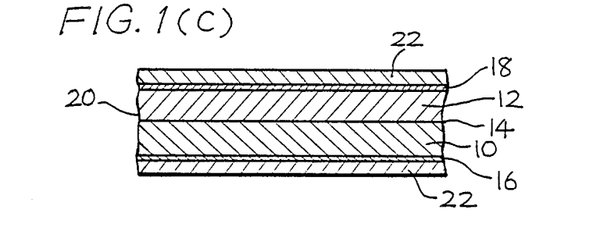

Referring to FIG. 1(C), as a contact layer a high impurity concentration layer 16 (implantation of P: $5 \times 10^{15}$ cm$^{-2}$) was formed in a back surface region of the p-type layer 10, and as another contact layer a high impurity concentration layer 18 (implantation of B: $5 \times 10^{15}$ cm$^{-2}$) in a surface region of the n-type layer 12. Then an aluminum electrode layer 22 was formed by a PVD technique on each surface of the substrate 20.

Figure 1D:
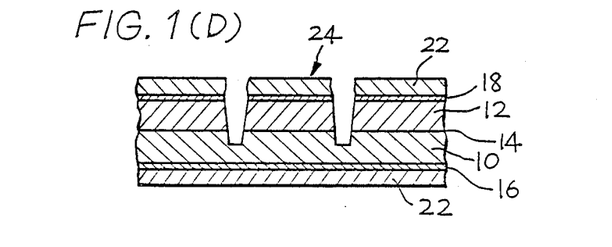

Referring to FIG. 1(D), the substrate 20 in the state of FIG. 1(C) was divided into a number of mesa diodes 24 each having 3-mm square side faces containing a junction 14 by the steps of first dicing with a diamond blade, next etching with a mixed liquid of hydrogen fluoride, nitric acid and acetic acid (1:7:2) at 30° C. for 3.5 min and further etching with another mixed liquid of hydrogen fluoride, nitric acid and acetic acid (1:2:7) at 30° C. for 6 min, and washing for about 1 hr in boiling trichloroethylene.

Comparative Example

The n-type wafer 12 in FIG. 1(A) was placed on the p-type wafer 10 without applying any liquid to either of the wafers. The combination of the two wafers 10, 12 was subjected to a heat treatment in an oxygen gas stream or a nitrogen gas stream at about 1000° C. for 16 hr. After that the diode producing process of Example 1, FIGS. 1(C) and 1(D), was repeated.

In both Example 2 and Comparative Example, separation at the interface 14 occurred in some of the mesa diodes 24. In each case the failure ratio was as shown in the following table.

|  | Failure Ratio (%) | Defectless Diodes (%) |
| --- | --- | --- |
| Ex. 2, using methanol | 21.6 | 78.4 |
| Ex. 2, using water | 1.3 | 98.7 |
| Comp. Ex., heating in $O_2$ | 26.1 | 73.9 |
| Comp. Ex., heating in $N_2$ | 18.5 | 81.5 |

Figure 2:
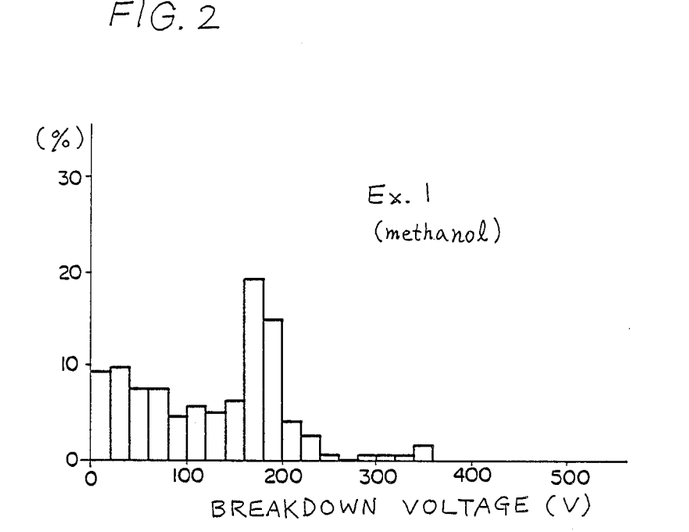
FIGS. 2 and 3 are histograms showing distribution of breakdown voltages of two lots of diodes, respectively, produced by the process illustrated in FIGS. 1(A) to 1(D)
Figure 3:
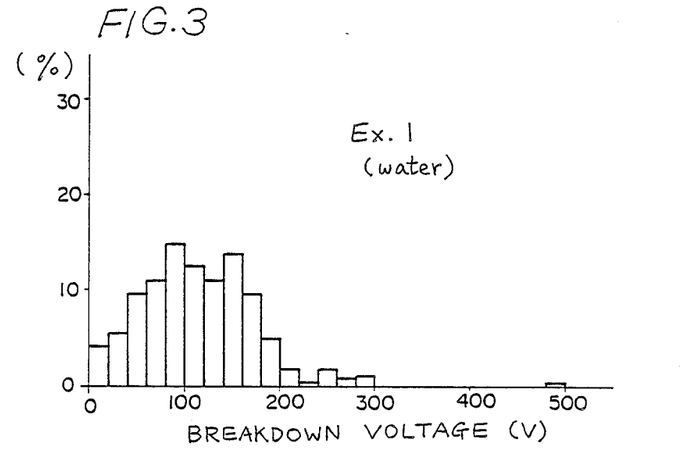
Figure 4:
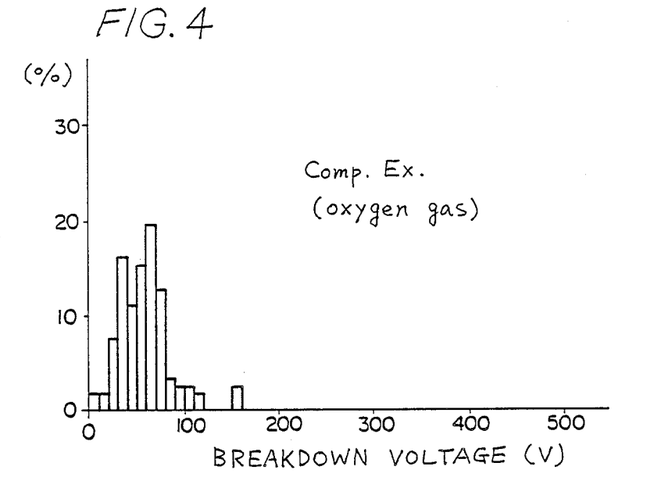
FIGS. 4 and 5 are histograms showing distribution of breakdown voltages of two lots of diodes, respectively, produced by a process resembling the process of FIGS. 1(A) to 1(D) but using a substrate joining method not in accordance with the invention.
Figure 5:
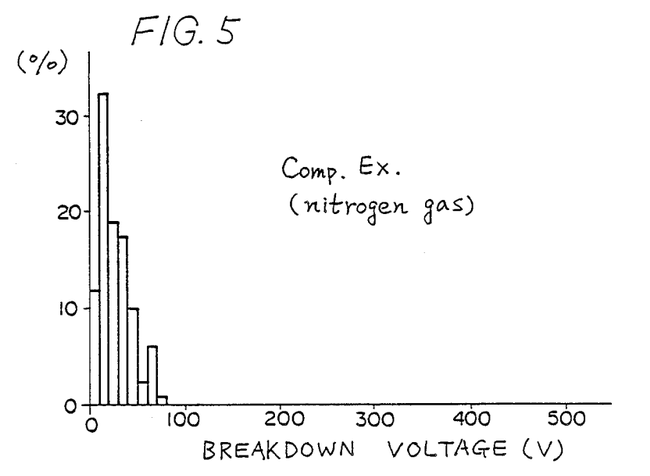

The characteristics of the mesa diodes produced in Example 2 and Comparative Example were measured soon after the washing in boiling trichloroethylene. There was a great difference in breakdown voltage between the products of Example 2 and the products of Comparative Example. Under the reversely biased condition, breakdown voltage (leakage current of 100 $\mu A$) was as high as 200V in the diodes produced in Example 2, using either methanol or water, but was 150V, at best in the diodes produced in the Comparative Example by heat treating in oxygen and was lower than 100V in the diodes produced in Comparative Example by heat treating in nitrogen. FIGS. 2 and 3 are histograms of the breakdown voltages of the diodes produced in Example 2 using methanol and water, respectively. FIGS. 4 and 5 are histograms of the breakdown voltages of the diodes of Comparative Example using oxygen and nitrogen, respectively, as the heating atmosphere.

Example 3

This example illustrates joining two silicon substrates, at least one of which has a polycrystalline silicon layer on the surface to be brought into contact with the other substrate. The joining provides a unitary substrate having a polycrystalline semiconductor layer sandwiched between two single crystal semiconductor layers.

Figure 6:
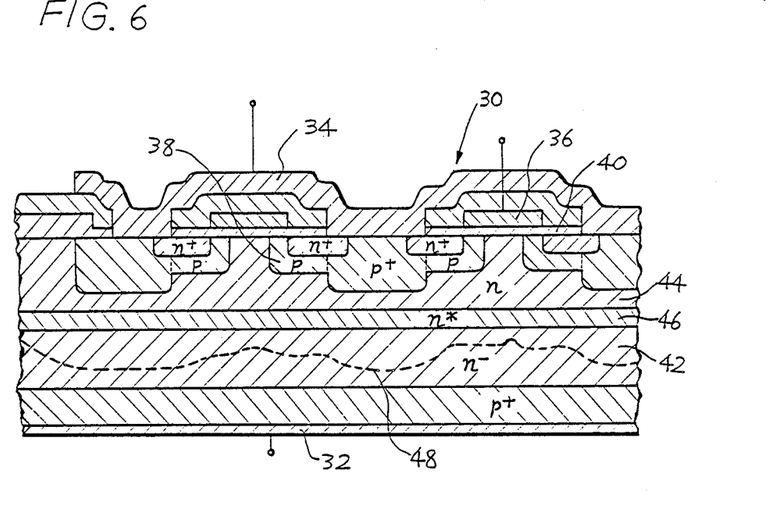
FIG. 6 is a sectional view of a MOS field-effect transistor which can be produced by using a method according to the invention.

Such a sandwich structure cannot be produced by conventional techniques since it is impossible to deposit a polycrystalline film on a single crystal substrate and then deposit or grow a single crystal layer on the polycrystalline layer. However, if the sandwich structure is realized, a great advantage is gained. For example, FIG. 6 shows a MOSFET 30 of conductivity modulation type constructed in a substrate having the sandwich structure. The MOSFET 30 has anode electrode 32, source electrode 34, gate electrode 36, p-type channel region 38 and gate oxide layer 40. In this MOSFET the n-type base region is separated into first n-type region 42 and second n-type region 44 by an intervening n*-type polycrystalline silicon layer 46 which serves as a recombination region. Numeral 48 indicates a depletion layer. The polycrystalline recombination layer 46, sandwiched between the n-type base regions 42 and 44, contains a large number of carrier recombination centers and, hence, has a great effect for prevention of latch-up. The presence of such an interlayer polycrystalline region is very effective also for prevention of, latch-up of CMOS-IC. Therefore, it is important to produce a sandwich structure having a polycrystalline layer between two single crystal layers as the basis of the manufacture of MOS-IC devices of high reliability.

In this example commercial 3-inch silicon wafers were used. First, a film of polycrystalline silicon having a thickness of about 3000 Å was deposited on the polished surface of a silicon wafer by a LPCVD method. Using a mixed gas of $SiH_4$ and He, the deposition was carried out at a temperature of 630° C. under a pressure of 0.6 Torr. The rate of deposition was about 100 Å/min. After annealing in nitrogen gas at about 1000° C. for about 2 hr, the polycrystalline silicon film was polished to provide a mirror-like surface below 500 Å in surface roughness.

The thus treated wafer was joined to another silicon (single crystal) wafer by the same method as in Example 1. In the clean room of Class 1000, the polished surface of the polycrystalline silicon film on one wafer and the polished surface of the untreated silicon wafer were uniformly wetted with methanol (guaranteed reagent), and the wetted surfaces were brought into tight contact with each other with care not to include bubbles in the methanol film. After sliding the two wafers on each other several times, the combination of the two wafers was left still in air under load of $10^{-1}$ kg/cm² for several hours until the wafers firmly and hardly separably joined to each other. Alternatively, relative sliding of the two wafers was repeated many times until the wafers firmly and hardly separably joined to each other. In another case, the polished surface of only one wafer was uniformly wetted with methanol, and the polished surface of the other wafer was brought into contact with the wetted surface with care not to include bubbles in the liquid film. In air the combination of the two wafers was placed horizontally on a hot plate kept at about 50° C. In several hours the two wafers joined firmly and tightly with natural conformance with each other in orientation flat. In every case the wetting and joining operations were carried out at normal temperature.

In this example too, the liquid to wet the wafer surfaces was not necessarily methanol and could be selected from various liquids such as ethanol, acetic acid, formic acid, water and aqueous ammonia solution.

Next, the seemingly unitary combination of the two wafers with the intervention of a thin film of methanol therebetween was heated at about 100° C. for about 30 min, and thereafter heated in a nitrogen gas atmosphere at about 1000° C. for about 2 hr.

Through the heat treatment the combination of the two wafers turned into a practically inseparably unitary substrate having a thin layer of polycrystalline silicon sandwiched between single crystal silicon layers. When the obtained substrate was forcibly separated into two halves at the region of the polycrystalline silicon film, most portions of the polycrystalline silicon film peeled off the wafer on which the film was initially deposited and remained on the opposite wafer.

In joining another pair of silicon wafers by the same method, a film of polycrystalline silicon film was deposited on the polished surface of each of the two wafers to join the wafers with their polycrystalline surfaces in contact with each other. In this case, forcible destruction of the obtained sandwich structure resulted in that the polycrystalline silicon film peeled in its entirety off one of the single crystal silicon surface and remained on the opposite single crystal silicon surface.

The above test results indicate that the strength of bond between the single crystal silicon surface and the polycrystalline silicon film deposited thereon is nearly equivalent to the strength of bond created by the joining process between the polycrystalline silicon film and the single crystal silicon surface and that the strength of bond created by the joining process between two films of polycrystalline silicon is comparable to the strength of the films themselves. The substrates having the sandwich structure were cut with a dicing saw into 5-mm square pieces, which were subjected to a compressive shearing strength test. The measurements of break strength ranged from 20 to 40 kg/cm$^2$.

As a supplementary experiment, an n-type polycrystalline silicon layer was inserted between a p-type single crystal silicon substrate and an n-type single crystal silicon substrate by the joining method of Example 3. By testing electrical characteristics the sandwich structure proved to be good in rectifying capability, sufficiently high in breakdown voltage and sufficiently low in leakage current.

Example 4

This example illustrates joining two semiconductor substrates at least one of which has a dielectric film on the surface to be brought into contact with the other substrate. The joining provides a unitary substrate having a dielectric buried layer therein.

In semiconductor integrated circuits, the circuit components are isolated from each other usually by using p-n junctions. However, as the degree of integration has been enhanced it has become difficult to adapt the p-n junction method to the tendencies of increasing isolation capacity and reducing the size of the individual components.

Under such circumstances an isolation method using a dielectric is preferable, particularly for circuits including high-voltage resistant components. For example, in a power IC including a power transistor for producing output and an integrated circuit to drive or control the power transistor it is very important to ensure electrical isolation of the power transistor from the driving or controlling circuit, and, often, isolation by a p-n junction is insufficient.

However, by conventional isolation methods using a dielectric it is not easy to surround some components by a dielectric. In particular, for electrically isolating a base region of a semiconductor substrate from the region where the circuit components are constructed, it is necessary to bury a dielectric layer in the substrate, but conventional methods for burying a dielectric in a semiconductor substrate involve various problems. For instance, in the case of an isolation method using a dielectric film supported by a polycrystalline structure the isolation is accomplished, after constructing the circuit components and isolating them from each other in lateral directions, by the steps of lapping the semiconductor substrate from the reverse surface to expose the lower part of the component region, forming a dielectric film such as an oxide film on the exposed surface and then forming a polycrystalline silicon layer on the dielectric film as a support structure. In this method, many restrictions are placed on the process to be employed, and the substrate is liable to warp because of a difference in the rate of thermal expansion between polycrystalline silicon and single crystal silicon. In the case of the so-called SOI method, a film of polycrystalline or amorphous silicon is formed on a dielectric layer precedingly formed on a single crystal substrate, and that film is converted into a single crystal film by irradiating with laser beam or electron beam. This method entails costly apparatus for using laser beam or electron beam, and restrictions are placed on the quality, size and shape of the obtainable single crystal film.

In this example of the invention a semiconductor substrate having a dielectric buried layer was easily obtained by the following process.

Commercial 3-inch silicon wafers were used. First an oxide film was formed on the polished surface of a wafer by heating the wafer in an oxygen gas atmosphere at about 1000° C. The thickness of the oxide film was about 1000 Å. That is, this oxide film was far thicker than an oxide film naturally formed on silicon wafer surfaces.

The thus treated wafer was joined to another silicon wafer by the same method as in Example 3, using methanol to wet the wafer surfaces to be brought into contact with each other. Said another silicon wafer was an untreated wafer in one case and a wafer having an oxide film formed by thermal oxidation in another case. In either case the two wafers firmly and immovably joined to each other. Then the combination of the two wafers was heated at about 100° C. for about 30 min and then subjected to a heat treatment in a stream of either oxygen gas or steam at about 1000° C. for about 2 hr.

Through the heat treatment the combination of the two wafers turned into a practically inseparably unitary substrate with a silicon oxide film buried therein. When the substrate obtained by using a wafer having an intentionally formed oxide film and an untreated wafer was forcibly separated into two halves at the region of the oxide film, most portions of the oxide film peeled off the wafer on which the film was initially formed and remained on the opposite wafer. In the case of the substrate obtained by using two wafers each having an intentionally formed oxide film, forcible destruction of the obtained sandwich structure resulted in that the oxide layer peeled in its entirety off one of the wafers and remained on the opposite wafer.

The above test results indicate that the strength of bond between the oxide film formed by thermal oxidation and the bulk of the silicon surface is nearly equivalent to the strength of bond created by the joining process between the oxide film and the polished surface of the opposite wafer and that the strength of bond created by the joining process between two oxide films is comparable to the strength of the oxide films themselves. The substrates obtained by the joining process were cut with a dicing saw into 5-mm square pieces, which were subjected to a compressive shearing strength test. The measurements of break strength ranged from 25 to 40 kg/cm$^2$. In repeating the wafer joining process the heating temperature at the final heat treatment was widely varied, and it was evidenced that the joint has a sufficient strength insofar as the heat treatment temperature is above about 700° C.

Example 5

This example illustrates joining two semiconductor substrates one of which has a groove or grooves in the surface to be brought into contact with the other substrate. In a unitary substrate obtained by the joining, each groove is used to form a dielectric layer in the interior of the substrate. In this example an organic dielectric layer was formed.

Figure 7A:
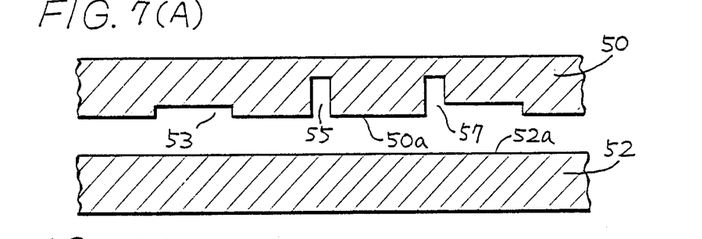
FIGS. 7(A) to 7(D) illustrate a process of producing a semiconductor substrate with dielectric layers embedded therein by using a method according to the invention.

FIG. 7(A) shows two semiconductor substrates 50 and 52 to be joined together. In this example these substrates 50, 52 were silicon wafers on the market. First, at least one of three types of grooves 53, 55, 57 was formed in the polished surface 50a of the wafer 50 by a wet or dry etching process using a photoresist mask prepared by photopatterning. The stepped groove 57 can be formed by two-stage etching to form the shallow region and the deep region in turn.

Then the two wafers 50 and 52 were joined by the same method as in Example 1. In most cases methanol was used to wet the surface 50a of the grooved wafer 50 and the polished surface 52a of the untreated wafer 52, though it was also possible to use a different liquid as mentioned in Example 1.

Figure 7B:
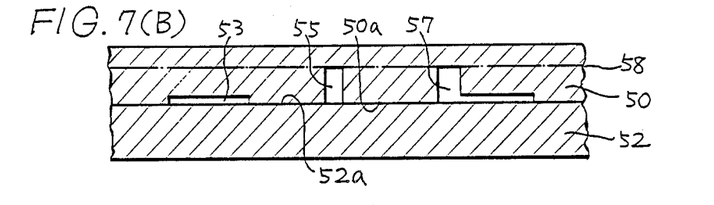

The two wafers 50 and 52 firmly and immovably joined to each other. Then the combination of the two wafers 50, 52 was heated at about 100° C. for about 30 min and thereafter subjected to heat treatment in a stream of nitrogen gas at about 1000° C. for about 90 min. Referring to FIG. 7(B), through the heat treatment the combination of the two wafers 50, 52 turned into a practically inseparably unitary substrate in which each of the grooves 53, 55, 57 of the first wafer 50 provided a tunnel-like channel. The strength of the joint between the two wafers 50, 52 was sufficiently high and comparable to the strength of the bulk of the silicon wafers, and such a strong joint was surely reproducible when the temperature at the final heat treatment was above about 500° C. By electrical testing the joint between the two wafers 50, 52 proved a good ohmic contact.

Figure 7C:
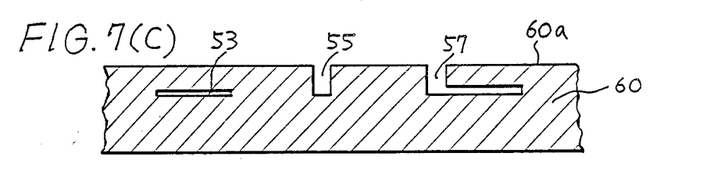

Next, the unitary substrate was lapped to remove the upper surface region to the extent of the plane 58. The resultant substrate 60 is shown in FIG. 7(C). In the original wafer 50 the grooves 55 and 57 were relatively deep grooves. In the obtained substrate 60 these grooves 55, 57 opened in the new surface 60a. The groove 53 seems to be entirely buried in the substrate 60, but at least one end section of this groove 53 opens in the surface 60a.

Figure 7D:
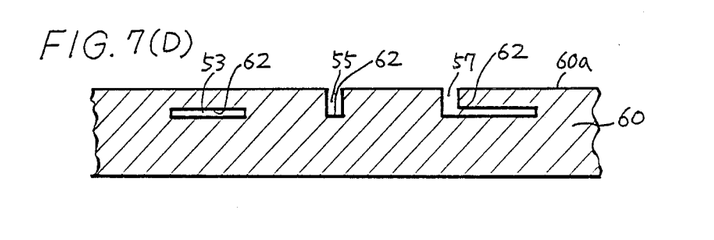

As shown in FIG. 7(D) each of the grooves 53, 55, 57 was used to form a dielectric layer 62 on the inner surfaces defining the groove by using a suitable resin. In practice the dielectric film 62 will be formed after constructing components of an integrated circuit on the substrate 60 in FIG. 7(C) by conventional techniques, interconnecting the components and forming a protective film such as PSG film or nitride film on the completed circuit. This is because the heat resistance of the resin as the material of the dielectric layer 62 may not be sufficient for endurance to the high temperatures employed in constructing and interconnecting the circuit components. If the resin is sufficiently high in heat resistance the dielectric layer 62 may be formed before constructing the circuit components.

In this example four kinds of commercial resins in solution form were alternately used to form the dielectric film 62: polyimide resin PIQ of Hitachi Kasei Co., polyimide resin IP-6001 of Kanebo N.N.C. Co., fluororesin FLUOROCOAT EC-104 of Asahi Glass Co., and fluorinated amide resin FA-7001 of Kanebo N.N.C. Co. Needless to mention, these resins were employed only by way of example. In every case the resin in the form of solution was introduced into the groove 53, 55 or 57 so as to uniformly cover the inner surfaces defining the groove. In the case of the simple groove 55 the object was easily accomplished by an ordinary spin coating method. In the case of the intricate groove 53 or 57 or a groove formed in a peripheral region of the circular substrate, a guide channel having an opening in a central region of the substrate was provided to the groove, and the resin solution was poured into the central opening and the substrate was spun in a saturated vapor of the solvent used in the resin solution. The substrate 60 was 3 in. in diameter, and a spin rate of 6000 rpm was employed.

At room temperature the viscosity of the resin solution was as follows.
PIQ (14.5%): 11 cp (solvent: NMP/DMAc)
IP-6001 (30%): 28 cp (solvent: NMP/xylene)
EC-104: 1.1 cp (solvent: Freon 113)
FA-7001 (30%): 50 cp (solvent: NMP/xylene)

According to the configuration and dimensions of the groove the resin solution was diluted with its solvent to suitably reduce viscosity. The fluororesin EC-104 was an aerosol which could be injected directly into the groove.

The film of the resin solution in the groove 53, 55, 57 was cured by heat treatment under the following conditions. PIQ: 60 min at 200° C. and then 30 min at 350° C.
IP-6001: 60 min at 300° C. and then 15 min at 400° C.
EC-104: 3 hr at 60° C. and drying at room temperature.
FA-7001: 60 min at 300° C. and then 15 min at 400° C.

After curing, the relative dielectric constant (at 1 kHz) of the dielectric film 62 ranged from 3.0 to 3.7, depending on the resin used. In every case, the dielectric film 62 endured temperatures of 200°-350° C., which are employed in the usual wire bonding treatment.

When the dielectric film 62 is formed in unnecessary regions, too, the film in such regions is removed by a suitable method such as $O_2$ plasma etching. In some cases, depending on the configuration of the groove in the substrate 60, the formation of the dielectric film 62 in the groove is naturally accompanied by formation of a dielectric film on the circuit components precedingly constructed on the substrate 60. It is possible to use the additionally formed dielectric film as a passivation film for isolation of the components and for protection of the components from corrosion and mechanical stresses.

Example 6

This example is a modification of Example 5 in respect of the type of the dielectric film formed in the aforementioned grooves. In this case an oxide film was formed.

Figure 8A:
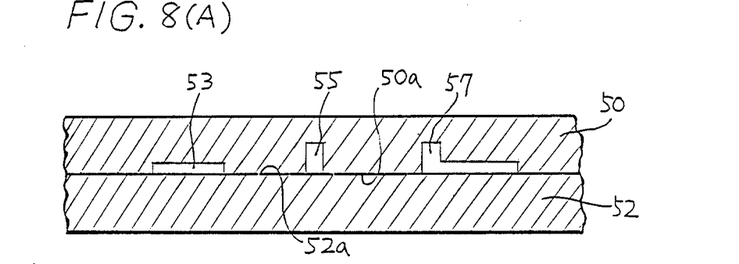
FIGS. 8(A) to 8(C) illustrate a process analogous to the process of FIGS. 7(A)-7(D) used to produce a semiconductor substrate with oxide layers embedded therein.
Figure 8B:
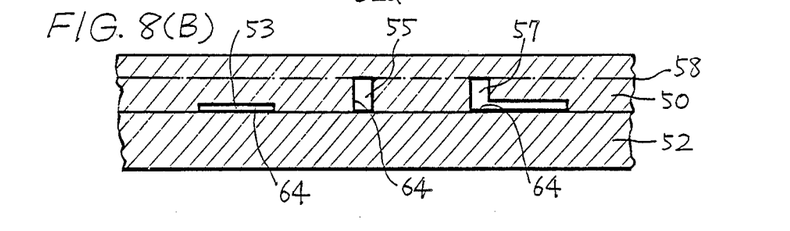

Referring to FIG. 8(A), the grooved wafer 50 and the untreated wafer 52 were joined by the same method as in Example 5. Referring to FIG. 8(B), the next step was forming an oxide film 64 in the groove 53, 55 or 57 by using a liquid composition for forming a silicon oxide film. By way of example, two kinds of liquid compositions were alternately used. The first liquid was a commercial product containing 9.1 wt % of Si, OCD of Tokyo Ohka Kagaku Kogyo Co., of the type known as spinon glass. The second liquid was a solution of a silicon alkoxide in an organic solvent such as an alcohol and optionally contained water for hydrolyzing the alkoxide together with an acid or base for adjusting pH. In particular the following composition was employed.

| | |
|---|---|
| $Si(OC_2H_5)_4$ | 1 mol |
| ethanol | 300 ml |
| water | 500 ml |
| HCl | 0.02 mol |

The mixture of these ingredients was subjected to reflux at about 90° C. for about 2 hrs to thereby obtain a uniform solution.

The selected liquid composition was introduced into the groove 53, 55 or 57 in FIG. 8(B) by the method described in Example 5. After that a heat treatment was made to convert the liquid film in the groove into a silicon oxide film. The particulars of the heat treatment were as follows.

OCD: in $N_2$ gas stream, 30 min at 150° C., and then 30 min at 900° C.

Silicon alkoxide solution: in $N_2$ gas stream, 30 min at 120° C., and then 60 min at 600° C.

In the latter case $SiO_2$ was formed through the following reactions.

$$Si(OC_2H_5)_4 + 4H_2O \rightarrow Si(OH)_4 + 4C_2H_5OH$$

$$Si(OH)_4 \rightarrow SiO_2 + 2H_2O \text{ (gas)}$$

Figure 8C:
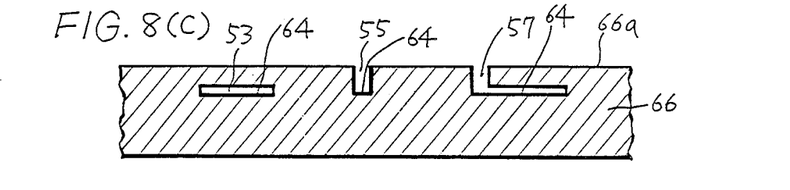

Next, the substrate was lapped to remove an upper region to the extent of the plane 58 indicated in FIG. 8(B). FIG. 8(C) shows the resultant substrate 66. On this substrate 66 components of an integrated circuit are to be constructed by conventional techniques.

In both Examples 5 and 6, the dielectric film 62 or 64 was formed by using a material that is liquid at normal temperature. This is because a liquid material is more suitable than a gaseous material. When a gaseous material is used to form a dielectric film in the groove, in particular the groove 53 or 57, it is often that the dielectric is formed preferentially in sections of the groove near the gas injection position so that the groove is choked before formation of the dielectric in the depths of the groove.

What is claimed is:

1. A method of joining two semiconductor substrates, comprising the steps of:
    providing two semiconductor substrates, each of which has a flat and polished surface;
    forming at least one groove in said polished surface of at least one of said two semiconductor substrates;
    wetting the polished surface of at least one of the two substrates with a liquid not containing any solute which causes precipitation of a solid substance when the liquid evaporates;
    placing one of the two substrates on the other so as to bring said surfaces of the respective substrates into contact with each other, with a thin film of said liquid therebetween to provisionally join the two substrates;
    subjecting the two substrates in the provisionally joined state to a heat treatment at a temperature lower than the melting temperature of the material of the semiconductor substrates; and
    forming a dielectric layer in said at least one groove, the dielectric layer being an organic polymer layer.

2. A method according to claim 1, wherein said liquid is an associative liquid.

3. A method according to claim 2, wherein said liquid is selected from the group consisting of alcohols, acidic acid, formic acid, water, and aqueous ammonia solution.

4. A method according to claim 1, wherein said liquid is methanol.

5. A method according to claim 1, wherein said heat treatment is carried out at a temperature in the range from about 500° C. to about 1200° C.

6. A method of joining two semiconductor substrates, comprising the steps of;
    providing two semiconductor substrates, each of which has a flat and a polished surface;
    forming at least one groove in said polished surface of at least one of said two semiconductor substrates;
    wetting the polished surface of at least one of the two with a liquid not containing any solute which causes precipitation of a solid substance when the liquid evaporates;
    placing one of the two substrates on the other, so as to bring said surfaces of the respective substrates into contact with each other, with a thin film of said liquid therebetween to provisionally join the two substrates;
    subjecting the two substrates in the provisionally joined state to a heat treatment at a temperature lower than the melting temperature of the material of the semiconductor substrates; and
    forming a dielectric layer in said at least one groove, the dielectric layer being an oxide layer formed by introducing a liquid composition comprising a silicon compound into said at least one groove and heating the liquid composition.

7. A method according to claim 6, wherein said liquid is an associative liquid.

8. A method according to claim 7, wherein said liquid is selected from the group consisting of alcohols, acidic acid, formic acid, water, and aqueous ammonia solution.

9. A method according to claim 6, wherein said liquid is methanol.

10. A method according to claim 6, wherein said heat treatment is carried out at a temperature in the range from about 500° C. to about 1200° C.

* * * * *